United States Patent [19]

Valentin

[11] Patent Number: 4,558,248
[45] Date of Patent: Dec. 10, 1985

[54] TEMPERATURE-COMPENSATED QUARTZ OSCILLATOR

[75] Inventor: Jean P. Valentin, Pouilley-les-Vignes, France

[73] Assignee: Etat Francais, Paris Armees, France

[21] Appl. No.: 606,248

[22] Filed: May 2, 1984

[30] Foreign Application Priority Data

May 3, 1983 [FR] France ............................. 83 07308

[51] Int. Cl.$^4$ ......................................... H01L 41/08
[52] U.S. Cl. ................................... 310/315; 310/360; 310/369; 310/349; 394/117; 331/116 R
[58] Field of Search ............... 310/360, 361, 340, 344, 310/346, 347, 349, 350, 363, 367, 369, 315, 314; 374/117, 177; 331/116

[56] References Cited

U.S. PATENT DOCUMENTS

| Re. 26,707 | 11/1969 | Cutler et al. | 310/349 X |
|---|---|---|---|
| 2,157,665 | 5/1939 | Hollmann | 310/350 X |
| 3,826,931 | 7/1974 | Hammond | 310/315 X |
| 3,978,432 | 8/1976 | Onoe | 310/315 X |
| 4,079,280 | 3/1978 | Kusters et al. | |
| 4,135,108 | 1/1979 | Besson | 310/349 X |
| 4,160,183 | 7/1979 | Kusters et al. | 310/315 |
| 4,317,059 | 2/1982 | Besson | 310/350 X |
| 4,334,168 | 6/1982 | Besson et al. | 310/349 X |
| 4,437,773 | 3/1984 | Dinger et al. | 374/117 |
| 4,464,598 | 8/1984 | Besson et al. | 310/349 X |

FOREIGN PATENT DOCUMENTS

| 0010046 | 4/1980 | European Pat. Off. |
|---|---|---|
| 2338607 | 8/1977 | France. |
| 510775 | 1/1977 | U.S.S.R. ................ 310/349 |

Primary Examiner—Mark O. Budd
Attorney, Agent, or Firm—Parkhurst & Oliff

[57] ABSTRACT

A temperature-compensated quartz oscillator having a first plate of quartz that carries a first electrode which displays a sensitivity to temperature that exceeds that of the piezoelectric quartz wafer which comprises a first resonator which vibrates at a reference frequency $f_M$. The first plate cooperates with the first electrode and a third electrode to form a second quartz resonator. Means for applying to the first and third electrodes an excitation electric power to drive the active portion of the first plate according to a mode which is sensitive to temperture, at a frequency $f_T$ close to, but slightly different from, the reference frequency $f_M$. Means for comparing, which enable comparison of signals at the terminals of the second and third electrodes, and control means for the regulating means for applying an excitation electric power from the active portion of the piezoelectric wafer.

12 Claims, 2 Drawing Figures

TEMPERATURE-COMPENSATED QUARTZ OSCILLATOR

FIELD OF THE INVENTION

This invention pertains to a temperature-compensated quartz oscillator, of the kind that includes first and second plates of dielectric material, which are placed facing one another but separated from one another, and on the inner sides of which first and second electrodes are respectively placed. A piezoelectric quartz wafer or crystal which is inserted between said first and second electrodes, without being in contact with those electrodes, and cut according to crystallographic section which provides low sensitivity to temperature, comprises a first quartz resonator with the first and second electrodes. Means for applying to the first and second electrodes electrical excitation power from the active section of the piezoelectric wafer, according to one embodiment, is selected to determine a reference frequency $f_M$.

BACKGROUND OF THE INVENTION

A quartz oscillator of the type which uses a quartz resonator with electrodes that do not adhere to the crystal was described, for example, in French Patent Application No. 2,338,607. Such an oscillator displays many advantages especially with respect to stability over time and mechanical stability. However, as in all categories of oscillators, changes in the ambient temperature induce variations in the frequency of the oscillator which result from changes in the temperature of the vibrating crystal.

In order to neutralize the effects stemming from changes in the ambient temperature, which can evolve on a large scale, for example from −40 degrees C. to +85 degrees C., we must place high stability quartz oscillators inside thermostats. And yet, a thermostat is a voluminous accessory, which consumes energy, and leads to a temperature-setting period that can be as high as one hour for pilot oscillators and very high stability oscillators, to twenty minutes or so with regard to less high performance pilot oscillators.

It turns out that in the realm of quartz oscillators, we are trying more and more to execute devices with reduced volume and mass, which consume less energy, and which display very high equilibrium. Under those circumstances, we must seek means other than thermostats in order to compensate for the effects of ambient temperature on the frequency that is supplied by a quartz oscillator.

Solutions have already been suggested. Among them, the most popular is that which provides electronic compensation for the oscillator frequency, with a variable capacitance diode that is mounted in series with the quartz resonator. With this type of assembly of a quartz oscillator that is temperature-compensated, known as TCXO, the capacitance of the variable capacitance diode is a function of constant voltage V which is derived from static voltage, through a potentiometric network that is comprised of resistors and thermistors. An adjustable compensation voltage is also opposed to the voltage that is output by the potentiometric network. According to a variation of that system, the variable capacitance is achieved by varying the gain from an amplifier, by using the Miller effect according to which the input capacitance of a gain amplifier G can vary like 1−G. This kind of solution is not always satisfactory in the case of high equilibrium oscillators because the implementation of a corrective network which makes use of thermistors to create a control voltage for a variable capacitance diode, or to make the amplifier gain vary, is restricted by the quality of the thermistors used.

Another solution, which was suggested in U.S. Pat. No. 3,826,931, used an algebraic combination of frequencies in which the sum $f = f_1 + K f_2$ displays for a given value of constant K a temperature coefficient of the first order that is equal to zero. Frequencies $f_1$ and $f_2$ are supplied by two piezoelectric resonators with double rotation which are cut inside two specific regions of a quartz crystal so that the specific orientations $\phi$ and $\theta$ of each resonator inside the crystal make it possible to obtain cancellation of temperature coefficients of the 2nd and 3rd order in the algebraic combination which relates f to $f_1$ and $f_2$. They finally obtain a frequency f which displays null temperature coefficients for the first three orders of the series development of the frequency-temperature law. However, this solution implies the use of double rotation quartz crystals which are cut in a very specific way in order to achieve compensation for the temperature influence.

A different means of obtaining a frequency with a biresonator that is independent from temperature was recommended by BESSON in the European Patent Application No. 0010046. This solution implements a device which includes two resonators with a single crystalline section of differing frequencies, which are excited within a system of condensors of which a frame is common to both resonators. To the extent that the heat behaviors of the resonators are identical, and by the comparisons which can be made from frequency-temperature curves for each resonator, it is possible to exploit a combination of frequencies for both resonators, this combination being a simple function of temperature. The formation of both resonators with a single crystalline section and identical heat behaviors can be delicate in some instances.

Finally, another form of compensation was recommended in U.S. Pat. Nos. 4,079,280 and 4,160,183. This solution uses a quartz resonator with a section having $\phi = 21.93$ degrees and $\theta = 33.93$ degrees, which operates simultaneously on two shearing modes with different thicknesses, modes B and C. A combination of both frequencies is applied to a microprocessor which corrects the frequency error that is due to temperature by way of an analog or digital compensation process. Thus, a reference frequency is artificially re-enacted. In this compensation mode, we use a single vibrating resonator in two different modes, so that its direct couplings may appear between the two vibration frequencies.

BRIEF SUMMARY OF THE INVENTION

The present invention is intended to remedy the previous disadvantages and to make it possible to provide compensation for the effects of ambient temperature on the frequency that is supplied by a quartz oscillator, in a simple way, which is not costly and which is efficient, and leads to a compact device that can be easily manufactured according to known methods.

These goals are attained with a quartz oscillator of the kind that is described at the outset of this specification in which, according to the invention, a first plate is formed by a quartz crystal that is cut according to a crystallographic section which provides sensitivity to temperature exceeding that of said quartz piezoelectric wafer, and cooperates with said first electrode and a third electrode that is placed on the outer side of the first plate to form a second quartz resonator, and which includes means for applying to the first and third electrodes an electric excitation power from the active section of the first plate according to a temperature-sensitive mode, at a frequency $f_T$ whose value is close to, but slightly distinct from, the reference frequency $f_M$. Comparison means for comparing signals at the terminals of the second and third electrodes and regulating means for applying an excitation electric power to drive the active section of the piezoelectric wafer of the first resonator according to the result from the comparison between frequencies $f_T$ and $f_M$, are also provided.

Thus, according to the invention, the main resonator which is designed to supply a reference frequency can be made from a quartz crystal which is cut according to a conventional section. The second resonator, which is designed to serve as a temperature sensor, can be cut from any portion of a quartz crystal and even according to an un-defined section, the only requirement being that it should display at least one vibration whose frequency is sufficiently temperature-sensitive.

The provision of a second resonator does not affect the compactness of the device, since one of the plates that supports an excitation electrode also acts as a second resonator. This arrangement also displays the advantage of placing the temperature sensor element very close to the piezoelectric wafer which comprises the main resonator.

The quartz piezoelectric wafer which makes up the main resionator is advantageously cut according to the crystallographic section AT ($\phi = 0$, $\theta = 35$ degrees and 25 minutes).

The quartz plate which makes up the second resonator can be cut according to the double rotation crystallographic section SC which displays a vibration mode which is very temperature sensitive.

According to another embodiment, the quartz plate which comprises the second resonator is cut according to a degenerate section which is close to section AT and which displays an angle $\theta$ close to 35 degrees and 25 minutes. This section is fairly sensitive to temperature and its use, combined with a section AT for the main resonator makes it possible greatly to limit the differential expansions between the main resonator and the second resonator.

According to a preferred embodiment, the first plate and the piezoelectric wafer are convexo-planar, the convex side of the piezoelectric wafer comprising the side which is located facing the second electrode which is placed on the inner side of the second plate, and the convex side of the first plate comprising the outer side of the first plate which carries the third electrode. The first electrode includes a metal layer with a low reflecting power and the surface of the inner side of the first plate is seasoned and not polished. Conversely, the third electrode includes a layer of metal that has high reflecting power, and the surface of the outer side of the first plate is polished. Furthermore, a fourth electrode which does not play an electric role is placed on the outer side of the second dielectric plate.

Advantageously, the second and fourth electrodes are formed in a way that is similar to the first and third electrodes respectively.

These various characteristics tend to facilitate heat exchange between the first and second resonators while restricting heat exchange between those resonators and the ambient environment.

Preferably, the first and second dielectric plates comprise quartz crystals with the same crystallographic section. This tends to render symmetrical the constraints borne from the differential expansion between the main resonator and the second resonator.

In the oscillator according to the invention, the comparison means for comparing the signals at the terminals of the second and third electrodes, respectively, includes a mixing circuit to which are applied the frequency signals $f_M$ and $f_T$ which respectively are present at the terminals of the second and third electrodes, and that circuit emits the output at a frequency signal $f_T - f_M$. A frequency divider circuit which receives reference signals with a frequency $f_M$, which signals are present at the terminal of the second electrode in order to supply clock signals at a pre-set rate, is also present. And, a meter to which are applied the frequency signals $f_T - f_M$ stemming from the mixer circuit, and whose timebase is comprised of the clock signals stemming from the divider circuit, is also present.

The oscillator includes means for calculating a corrective function signal of the type of crystallographic section of the quartz wafer and of the value of the signal stemming from the meter, which is representative of the temperature of the first plate, and means to alter, according to the corrective signal, the control of means for applying an excitation electric power to drive the active section of the piezoelectric wafer.

In a more specific way, the means for calculating a corrective signal include a fast memory with a data table or program which provides at the output a number that is proportional to the power to be applied to the resonator as a function of the input temperature, the fast memory being addressable by the signal stemming from the meter and said means for altering the control of means for applying an excitation electric power including a digital-analog converter to which output information is applied from the fast memory and an automatic gain command circuit which receives the voltage signal from the digital-analog converter and controls the operating power of the excitation amplifier whose output is connected to the second electrode.

BRIEF DESCRIPTION OF THE DRAWINGS

Other characteristics and advantages of the invention shall emerge from the description that follows of a particular embodiment of the invention, with reference to the attached drawing wherein.

DETAILED DESCRIPTION

Figure 1:
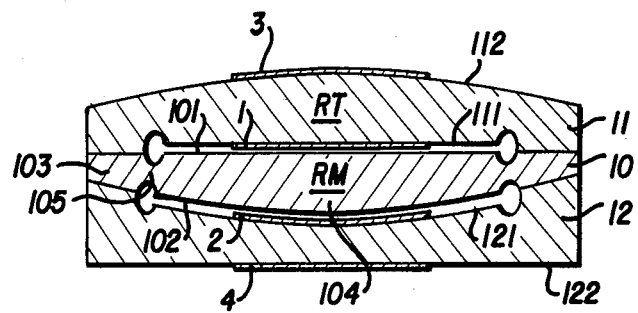
FIG. 1 is a sectional view of a main resonator that is associated with two support plates of electrodes in conformance with the invention.

We see in FIG. 1 the structure of a metrological resonator $R_M$ with electrodes which are not adhered to the crystal, which is built in the manner described, for example, in French Pat. No. 2,338,607. A piezoelectric wafer or crystal 10, which includes a main active section 104 which is connected to a peripheral section 103 by narrowed bridges 105, is inserted between two plates 11, 12 of dielectric material each bearing an electrode 1,2 respectively on its inner side 111, 121 respectively, located facing the piezoelectric wafer 10. The peripheral section 103 of the piezoelectric wafer 10 is assembled in sandwich form between the plates 11 and 12 and it enables immobilizing the main active section 104 of the wafer 10 facing the electrodes 1, 2 and at a small distance from the latter, the portion of the inner sides 111, 121 of the plates 11, 12 that bear the electrodes 1, 2 being slightly withdrawn in relation to the portion of the inner sides 111, 121 which are in contact with the peripheral section 103 of the wafer 10. The main portions of the opposing sides 101, 102 of the wafer 10 are thus located facing the electrodes 1,2 respectively, but without being in contact with the latter.

The main resonator $R_M$ which is comprised of the piezoelectric wafer 10 is excited with the set of electrodes 1, 2 which are not adhered to the crystal wafer, in one of the modes that is conventionally used for a metrological resonator, for instance in the 5 MHz mode, partial 5, for a wafer or crystal 10 cut according to the crystallographic section AT ($\phi=0$, $\theta=35$ degrees and 25 minutes) which displays the advantage of supplying a metrological frequency $f_M$ that depends little on temperature.

An adaptation of the structure that we have described in this invention makes it possible to regulate the metrological frequency $f_M$, in order to compensate for the frequency variations, however low, that are triggered by the temperature changes in the ambient environment in which the resonator $R_M$ is located.

According to the invention, the first plate 11 is formed to comprise a second piezoelectric resonator that supplies a frequency $f_T$ which heavily relies on temperature. The first plate 11 therefore must be cut from a quartz crystal, but it can be cut in any portion of such a crystal and according to an undefined section, the only requirement being that it should display at least one vibration whose frequency is sufficiently temperature-sensitive.

The secind resonator $R_T$ is comprised therefore of the first plate 11 made of quartz which cooperates with both electrodes 1 and 3 which are deposited respectively on the inner side and the outer side of the first plate 11. The electrode 1 which is placed on the inner side of the first plate 11 is common to the main resonator and to the second resonator, while the additional electrode 3 plays a role only with regard to the second resonator, which is excited with the set of electrodes 1, 2 in an especially temperature-sensitive mode. As a result of its make-up, the second resonator, which is comprised of the first plate 11 and the electrodes 1, 3 which are placed on this plate, displays aging and quality which are not as good as those of the main resonator which is comprised of the quartz wafer 10 and the electrodes 1, 2. This in no way represents a disadvantage, because the frequency $f_T$ of the second resonator is not designed to be used as a reference frequency, but simply as a signal which provides information regarding the temperature of the first plate 11 and, in so doing, of the piezoelectric wafer 10.

The first piezoelectric plate 11 displays an outer convex side 112 which is spherical, to facilitate the entrapment of vibrating energy in the plate which is designed to comprise the second resonator which acts as a temperature sensor. The piezoelectric wafer 10 proper is convexo-planar in a conventional sense. For purpose of symmetry, the plane sides 101, 111 of the wafer 10 and the first plate 11 are located facing one another and they cooperate with the first electrode 1, while the convex sides 102, 112 of the wafter 10 and of the first plate 11, respectively, are roughly symmetrical in relation to the plane which contains the first electrode 1, and they respectively cooperate with the second and third electrides 2, 3.

A fourth electrode 4 is placed on the outer side 122 of the second plate 12 in order to guarantee symmetry of heat exchange through radiation, and to reduce the inner heat gradient of the assembly. This fourth electrode 4 therefore plays no electrical role but, still for reasons of symmetry, it can be connected by a metal conductive wire that is identical to those which supply the first, second and third electrodes 1, 2, 3 to a terminal of the sealed casing inside which the unit is assembled from wafer 10 and the plates 11, 12.

As stated previously, the crystallographic sections of the wafer 10 and of the first plate 11 are different from the outset. Under those circumstances, any change in temperature leads to differential expansion, which is not equal to zero, between the wafer 10 and the first plate 11. In order to render symmetrical the constraints which are generated by this differential expansion, we select the same material and the same crystallographic section for the first and second plates 11, 12. Furthermore, the heat constraints, at the level of the metrological resonator which is made of the wafer 10 and the electrodes 1, 2 can be rendered insignificant if the main active section 104 of the wafer 10 is connected to the peripheral section 103 by way of elastic bridges whose location is a function of the crystallographic axes of the crystal.

The second resonator 11, which is deposited immediately adjacent the quartz wafer 10, supplies information which is directly related to the temperature of that quartz wafer 10 and it therefore takes into account both temperature changes in the ambient environment which affect the quartz wafer 10 and temperature changes in the quartz wafer 10 that are induced by an internal heating effect from the vibrating portion of that quartz wafer 10. Actually, the heat exchanges between the quartz wafer 10 and the first plate 11 are performed basically through radiation between the first electrode 1 and the surface 101 of the wafer 10 which faces the first electrode 1. These heat exchanges are very fast. In order to increase the emissive power of the first electrode 1, we also can form this electrode by the deposit of a metal, low reflecting power layer, which is formed for instance of platinum or copper, and the inner surface 111 of the first plate 11 is preferably maintained in a seasoned, unpolished condition. On the contrary, in order to restrict to the extent possible the exchange through radiation between the first plate 11 and the outside, the outer surface of the first plate 11 is carefully polished, and the third electrode 3 is formed by the deposit of a thin layer of metal with high reflecting power, like gold. For reasons of thermal symmetry, the second electrode 2 is formed in a manner similar to the first electrode 1 and the fourth electrode 4 is formed in a manner similar to the third electrode 3.

Above we mentioned that the metrological resonator could be cut according to a section AT with an angle $\theta = 35$ degrees and 25 minutes. Indeed, this section provides, in the temperature range of $-40$ degrees C. to $+85$ degrees C., the best natural temperature compensation. Therefore, among all the familiar sections, it displays the lowest relative frequency variation over the overall temperature range. Therefore, it is also the section for which the required frequency correction is minimal. The frequency-temperature curves for sections in the AT family are known, so we have verified that the best compensation is obtained for $\theta = 35$ degrees and 25 minutes. For this section, the relative optimal frequency gap is $8.10^{-6}$ (at about $-7$ degrees C.) and $-8 10^{-6}$ (at about 58 degrees C.). And yet, the measure of the amplitude-frequency effect (A.F. effect) of the AT section shows that it is a linear phenomenon which, in the case of a 4 MHz $P_5$ resonator mode C, is calculated with a relative positive frequency variation of about $5.10^{-6}$/mW. In order to compensate at $-7$ degrees C. the temperatures effect on the frequency with the A.F. effect, we must reduce the excitation power of the vibration by $8.10^{-6}/5.10^{-6} = 1.6$ mW, and increase that power by 1.6 mW at 58 degrees C. The measurements which were performed in that power range showed that this operation is indeed possible with low aging values.

Any crystallographic section which has a temperature-sensitive mode can be used to form the first plate 11 which comprises the second resonator. It simply has to display average sensitivity of about $2.10^{-6}$/degrees C. or more in relative value over the range of temperature between $-40$ and $+85$ degrees C. Of course, along this entire range, the variation in frequency with temperature has to be relatively stable in order to obtain temperature determination at the meter.

In the event that the quartz wafer 10 is an AT section, we can use, especially for plates 11, 12, a degenerate section which is close to the section AT and that displays an angle $\theta$ close to 35 degrees and 25 minutes. This section turns out to have sufficient sensitivity to temperature, and its use displays the advantage of restricting almost to zero the differential expansions between the elements which comprise the metrological resonator $R_M$ and the second resonator $R_T$.

Figure 2:
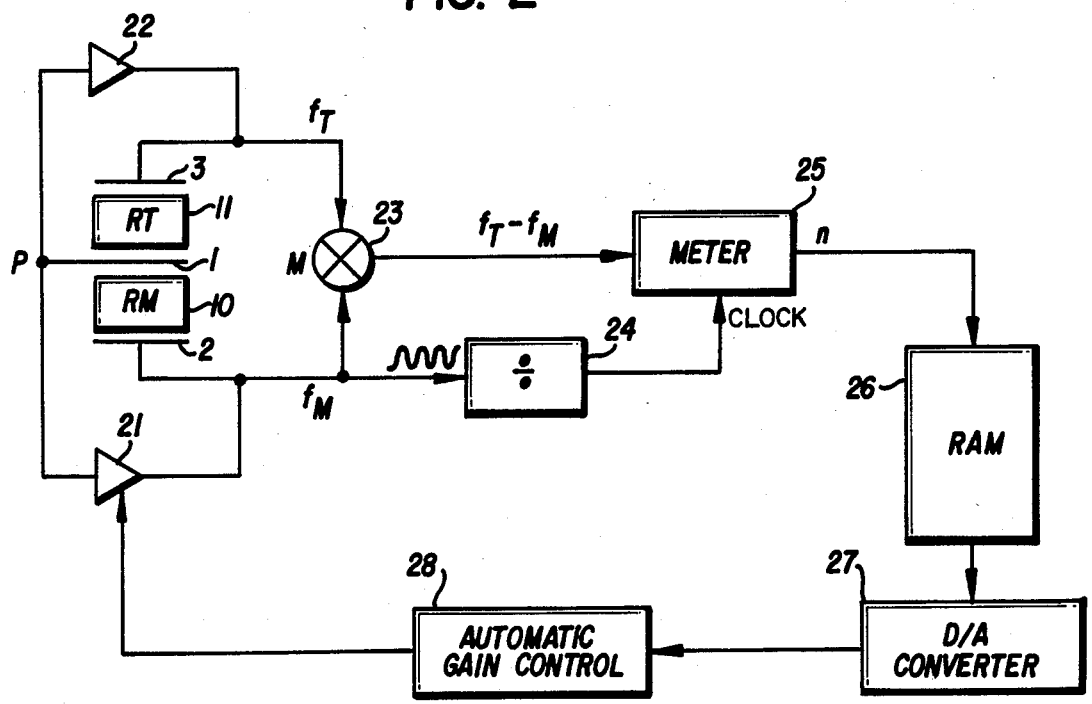
FIG. 2 depicts a diagram of a quartz oscillator according to the invention which uses the resonator system of FIG. 1.

Now we will describe, with reference to FIG. 2, the diagram of a quartz oscillator which uses the resonators of FIG. 1 automatically to conduct compensation for effects stemming from variations in temperature of the metrological resonator which comprises the wafer 10 and the electrodes 1, 2, which are not adhered to that wafer.

In FIG. 2, we recognize the main resonator $R_M$ which is comprised of the quartz wafer 10 and the first and second electrodes 1, 2, and the additional resonator $R_T$ which is comprised by the first quartz plate 11 that is associated with the first and third electrodes, 1, 3 which adhere to the plates. The electronic vibration maintenance circuits in the main resonator $R_M$ and the additional resonator $R_T$ include amplifiers 21, 22, respectively, which display a common point P that corresponds to the first electrode 1 which is commion to the two resonators $R_M$ and $R_T$. In a conventional way, the resonators $R_M$ and $R_T$ are placed in the reaction loops of the amplifiers 21, 22.

As stated previously, the main resonator $R_M$ includes a piezoelectric wafer 10 which is cut according to a crystallographic section which, when it is excited by the amplifier 21, supplies a metrological frequency $f_M$ which depends little on temperature. The second resonator $R_T$, which includes the quartz plate 11 that supports one of the electrodes 1 of the main resonator $R_M$, supplies, when it is excited by the amplifier 22, a frequency $f_T$, which, as a result of the kind of crystallographic section that is selected for the plate 11, is heavily dependent upon the temperature of that plate 11, and therefore from the neighboring quartz wafer 10. The temperature information which is obtained from the frequency $f_T$ makes it possible to control, by way of computation circuits, the electric power which is applied to the main resonator $R_M$, and therefore, through an amplitude-frequency effect, the value of the metrological frequency $f_M$ from the resonator $R_M$. The metrological frequency $f_M$ can therefore be directly regulated from the temperature information supplied by the second resonator $R_T$. This is possible as a result of the fact that the law of vibration frequency variation for a quartz crystal in relation to temperature is well known for a given crystallographic section, as well as the relation between the vibration amplitude and the resonance frequency, so that at each temperature information point, a table of values recorded into a memory or a microprocessor make it possible to determine automatically the correction to provide the feed of the main resonator $R_M$ in order to compensate for frequency variations introduced by temperature variations.

In the diagram of FIG. 2, the frequency signals $f_M$ and $f_T$ which are on the terminals of the electrodes 2 and 3 respectively, are applied to mixer 23 that supplies at the output a frequency signal $f_T - f_M$ which is applied to meter 25. The frequency signal $f_M$ is also applied to a divider circuit 24 whose output supplies to meter 25 clock signals which comprise a time base for the meter and enable the meter to supply a representative number of $f_T - f_M$. As an example, for a frequency $f_M$ of 5 MH$_z$, the divider circuit can divide by 500,000 to supply a time base of about 0.1 sec. The number of n beats that are counted at the output of the meter 25 makes it possible to address on a preset number of bits, for instance 11 bits, a fast memory 26 of the RAM type which was previously programmed with a table that provides at the output a number which is proportional to the power to be applied to the resonator $R_M$ according to the input temperature. The digital information, for example on 8 bits, which is fed at the output of the memory 26, is converted into voltage by the digital-analog converter 27 whose output is applied to the circuit 28 for automatic gain control that controls the operating power of amplifier 21.

Below, we provide an operating example as applied to a wafer 10 with a section AT and which uses a current RAM 2k octet memory 26 with addressing on 11 bits. The 2048 addresses will correspond to the temperature information, which, in the $-40$ to $+85$ degrees C. range leads to temperature increments of $125/2048 = 0.06$ degree C. The frequency/temperature curve of the section AT displays an optimal slope of $0.8.10^{-6}$/degrees C. Therefore, a 0.06 degrees C. increment corresponds to the greatest extent to a relative frequency variation of $0.8.10^{-6} \times 0.06 = 5.10^{-8}$. We might increment more finely inside the zones with a significant slope, and more crudely when we are close to the two zones with a horizontal tangent. The output of the memory is at 8 bits, so we have 256 different data to control the power of the metrological vibration and therefore its frequency $f_M$ by way of the amplitude-frequency effect. For a range of relative frequency variation equal to $2 \times 8.10^{-6}$, the increment is $2 \times (8.10^{-6}/256) = 6.3.10^{-8}$ as a relative frequency variation $\Delta f/f$, or $6.3.10^{-8}/5.10^{-9} = 12.6$ microwatts. The frequency stability is provided by:

$\Delta f/f = 6.3.10^{-8}$ between $-40$ degrees C. and $+85$ degrees C.

This result is about twenty times better than that which is obtained with a good crystal oscillator of the TCXO type which is temperature compensated over the same temperature range.

Examples of values for frequencoes $f_T$ and $f_M$ are provided below. The frequency $f_M$, may be 5 MHz. The frequency value $f_T$ relies on the section which is used for the resontator $R_T$. If we take section SC, which displays a mode B which is highly temperature-sensitive, it is advantageous to regulate the resonator $R_T$ to obtain $f_T = 5010$ kHz at 25 degrees C. The temperature sensitivity of the mode B 5 MHz $P_3$ with a section SC is about $-165$ Hz/degree C. and the variation is fairly linear. Therefore, we will have at about 85 degrees C., $f_T = 5000$ kHz and at about $-40$ degrees C. $f_T = 5020$ kHz. The difference $f_T - f_M$, which is therefore between about 0 and 20 kHz, will supply after metering a digital information n between 0 and 2000, which is therefore well adapted to the addressing of a memory 26 such as the RAM memory previously mentioned. The accuracy of this digital temperature information must be compatible with the desired resolution (temperature increment = 0.06 degrees C.). This accuracy is related to the $f_T$ temperature sensitivity, or here in relative value (recorded at the optimal frequency of the beat $f_T - f_M$): $165/20.10^{-3}$/degree C. $= 8.2.10^{-3}$/degree C. And yet, the time base acting as a clock for the meter displays the same relative accuracy as the frequency $f_M$ which is not compensated, or $1.6.10^{-5}$. Absolute measuring accuracy on temperature is therefore provided to:

$$1.6.10^{-5}/8.2.10^{-3} = 2/1000\text{th of a degree.}$$

This accuracy is quite sufficient for a temperature increment of 0.06 degrees C. It is clear that sharply lower accuracy might suffice here. We also see that a memory capacity which is much more significant we can also reach relative frequency equilibrium that exceeds $2.10^{-9}$ in the $-40 + 80$ degrees C. range.

What is claimed is:

1. A temperature compensated quartz oscillator, comprising:
   first and second plates of dielectric material arranged face to face and separated from each other, with first and second electrodes on the inner sides respectively of each of said first and second plates;
   a piezoelectric wafer of quartz having an active vibration portion located between, and spaced from, said first and second electrodes, said quartz wafer having been cut according to a crystallographic section which has a low temperature sensitivity, said wafer and first and second electrodes comprising a first quartz resonator; and
   means for applying to said first and second electrodes excitation electric power to drive active portion of the wafer according to an operative mode thereof having a reference frequency $f_M$,
   wherein the first dielectric plate comprises a quartz crystal cut according to a crystallographic section which has a temperature sensitivity which exceeds the sensitivity of the quartz piezoelectric wafer, and said first dielectric plate cooperates with said first electrode and a third electrode located on the outer surface of the first plate to form a second quartz resonator, and
   means for applying to said first and third electrodes electric excitation power to drive the active portion of the first dielectric plate according to a temperature-sensitive mode having a frequency $f_T$ close to, but slightly different from, the reference frequency $f_M$,
   means for comparing signals at terminals of the second and third electrodes,
   and means for regulating the means for applying an electric excitation power to drive the active portion of the piezoelectric wafer of the first resonator based on the comparison of signals at the terminals of the second and third electrodes.

2. The oscillator of claim 1, wherein the first dielectric plate and the piezoelectric wafer are convexo-planar, the convex side of the piezoelectric wafer comprising the side facing the second electrode on the inner side of the second dielectric plate, and the convex side of the first dielectric plate comprising the outer side of the first dielectric plate which carries the third electrode.

3. The oscillator of claim 1, wherein the first and second dielectric plates comprise quartz crystals with the same crystallographic section.

4. The oscillator of claim 1, additionally comprising a fourth electrode, which does not play an electric role, on the outer side of the second dielectric plate.

5. The oscillator of claim 1, wherein the piezoelectric wafer comprises a quartz crystal which is cut according to the crystallographic section AT, $\phi = 0$, $\theta = 35$ degrees and 25 minutes.

6. The oscillator of claim 1, wherein the first plate comprises a quartz crystal which is cut according to the double rotation SC crystallographic section.

7. The oscillator of claim 5, wherein the first dielectric plate comprises a crystal quartz that is cut according to a degenerate section close to section AT and displaying an angle close to 35 degrees and 25 minutes.

8. The oscillator of claim 1, wherein the first electrode includes a metal layer with low reflecting power, and the surface of the inner side of the first dielectric plate is seasoned and unpolished.

9. The oscillator of claim 1, wherein the third electrode includes a layer of a metal with high reflecting power, and the surface of the outer side of the first dielectric plate is polished.

10. The oscillator of claim 1, wherein the means for comparing the signals at the terminals of the second and third electrodes comprises a mixer circuit to which is supplied the frequency $f_M$ and frequency $f_T$ signals respectively at the terminals of the second and third electrodes, and which issues an output frequency signal $(f_T - f_M)$; a divider frequency circuit which divides the reference signals with a frequency $f_M$ at the terminal of the second electrode to supply clock signals at a pre-set rate; and a meter to which is supplied the frequency $f_T - f_M$ signals from the mixer circuit and whose time base comprises the clock signals from the divider circuit.

11. The oscillator of claim 10, further comprising means for calculating a correction function signal for the type of crystallographic section of the quartz piezoelectric wafer based on the value of the signal from the meter, which is representative of the temperature of the first dielectric plate, and means for altering, according to the correction signal, control of the means for applying an excitation electric power to drive the active portion of the piezoelectric wafer.

12. The oscillator of claim 11, wherein the means for calculating a correction signal comprises a fast memory equipped with a program which feeds at its output a number which is proportional to the power to apply to the resonator according to the temperature at the input, the fast memory being addressed by a signal from the meter, and wherein said means for altering the control of the means for applying an electric excitation power comprises a digital-analog converter to which output information is supplied from the fast memory and an automatic gain control circuit which receives the voltage signal from the digital-analog converter and controls the operating power of an excitation amplifier whose output is connected to the second electrode.

* * * * *